(12) United States Patent
Fujii et al.

(10) Patent No.: US 6,746,963 B2
(45) Date of Patent: Jun. 8, 2004

(54) METHOD FOR PROCESSING COATING FILM AND METHOD FOR MANUFACTURING SEMICONDUCTOR ELEMENT WITH USE OF THE SAME METHOD

(75) Inventors: Yasushi Fujii, Kanagawa (JP); Hiroyuki Iida, Kanagawa (JP); Isao Sato, Kanagawa (JP); Kazumasa Wakiya, Kanagawa (JP); Shigeru Yokoi, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/136,744

(22) Filed: Apr. 30, 2002

(65) Prior Publication Data

US 2002/0164886 A1 Nov. 7, 2002

(30) Foreign Application Priority Data

May 1, 2001 (JP) ........................................ 2001-133785

(51) Int. Cl.⁷ ............................................. H01L 21/302
(52) U.S. Cl. ...................... 438/706; 438/710; 438/712; 438/720; 438/745; 216/67; 134/1.1
(58) Field of Search ................................. 438/706, 710, 438/712, 720, 745, 750; 216/67; 134/1.1, 1.2

(56) References Cited

U.S. PATENT DOCUMENTS 4,165,295 A * 8/1979 Vander mey ................. 252/143
5,728,630 A * 3/1998 Nishimura et al. ........... 438/763
6,172,152 B1   1/2001 Kim et al.
6,387,819 B1 * 5/2002 Yu ................................ 438/725
6,395,651 B1 * 5/2002 Smith et al. .................. 438/787
6,413,882 B1 * 7/2002 Leung et al. ................. 438/781

FOREIGN PATENT DOCUMENTS

| EP | 1 077 479 A1 | 2/2001 |
| EP | 1 081 750 A2 | 3/2001 |
| EP | 1 094 506 A2 | 4/2001 |
| EP | 1 063 689 A1 | 12/2001 |
| JP | 11-040813 | 2/1999 |
| JP | 11-162969 | 6/1999 |
| JP | 2000-174023 | 6/2000 |
| JP | 2000-174121 | 6/2000 |
| JP | 2000-352827 | 12/2000 |

* cited by examiner

*Primary Examiner*—Lan Vinh
(74) *Attorney, Agent, or Firm*—Carrier Blackman & Associates, P.C.; Joseph P. Carrier; William D. Blackman

(57) ABSTRACT

A method for processing a coating film includes the steps of forming a silica group coating film having a low dielectric constant on a substrate, conducting an etching process to the silica group coating film through a photoresist pattern, and processing the silica group coating film with plasma induced from helium gas. With this, it is possible to prevent the silica group coating film from being damaged when a wet stripping process is conducted to remove the photoresist pattern as a subsequent process, and to maintain the low dielectric constant of the coating film.

18 Claims, 4 Drawing Sheets

METHOD FOR PROCESSING COATING FILM AND METHOD FOR MANUFACTURING SEMICONDUCTOR ELEMENT WITH USE OF THE SAME METHOD

BACKGROUND OF THE INVENTION

1. Field of the Invention

The present invention relates to a method for processing a silica group coating film having a low dielectric constant, and more specifically to a method for processing a silica group coating film having a dielectric constant equal to or less than 2.7 in the formation of a multi-layer wiring structure using a copper damascene method.

2. Description of Prior Art

The need for high integration of semiconductor devices is increasingly rising, and now we are entering into a generation of 0.13 µm gate lengths. It is already recognized that, by using Cu as a wiring material in such instances in place of the conventional Al, the characteristics of manufactured semiconductor elements can be improved in the following is aspects.

Cu is superior to Al in tolerance for EM (i.e., electromigration). Also, Cu has low resistance, and thereby it is possible to reduce signal delay due to wiring resistance. The use under high current density can be achieved, that is, an allowable current density can be improved by three (3) times or more by the use of Cu as described herein, and thereby the width of wiring used can be fine.

However, since it is difficult to control the etching rate of Cu compared to Al, a copper damascene method attracts attention as a method for realizing multi-layer wiring of Cu without any etching process. Proposals have been made (for example, Japanese unexamined patent application publication No. 2000-174023 and Japanese unexamined patent application publication No. 2000-174121).

Explanation of the copper damascene method will be given with reference to FIG. 7.

First, as shown in FIG. 7(a), an intermediate insulating film, being comprised of $SiO_2$ deposited through a CVD method or of SOG and having a low dielectric constant, is formed on a substrate, and a resist mask having a pattern is provided thereon. By etching, as shown in FIG. 7(b), trench pattern is formed. Next, as shown in FIG. 7(c), the trench pattern is lined with barrier metal, and as shown in FIG. 7(d), Cu is embedded into the trench by means of electrolysis plating so as to form a lower layer wiring. After polishing the barrier metal and Cu by chemical polishing, another intermediate insulating film is formed thereon as shown in FIG. 7(e). In the same manner, by selectively etching the intermediate insulating film through a resist mask having a pattern, as shown in FIG. 7(f), via-holes (or contact holes) and trench holes (i.e., gutters for an upper layer wiring) are formed (dual damascene). As shown in FIG. 7(g), the via-holes and the trench-holes for an upper layer wiring are lined with barrier metal and, as shown in FIG. 7(h), Cu is embedded into the via-holes and the trench-holes for an upper layer wiring by means of electrolysis plating or the like, and thereby an upper layer wiring is formed.

In the above-mentioned explanation, copper is used for forming wiring in a damascene method. However, a damascene method forming can be conducted with aluminum. The present invention can be applied to a damascene method using various conductive metals as alternatives to copper.

When multi-layer wiring is formed by a damascene method, it is required that an aspect ratio (i.e., height/width) of via-holes should be increased for fine wiring. However, if $SiO_2$ formed through a CVD method is used for an intermediate insulating film, the aspect ratio will be at most 2. Also, the dielectric constant of $SiO_2$ is relatively high ($\epsilon$=4.1), which is not satisfactory.

The use of organic or inorganic SOG having a lower dielectric constant has been examined as a means of overcoming this drawback. Further, it is desired to make organic or inorganic SOG having a lower dielectric constant.

It is recognized that the dielectric constant of an intermediate insulating film can be decreased by making the intermediate insulating film porous. However, the lower dielectric constant of such an intermediate insulating film corresponds to a decrease in the density of the film. As a result, alteration or corrosion occurs in the surface of the intermediate insulating film when wet stripping of a resist film is conducted as a subsequent process, and thus it is difficult to obtain a reliable semiconductor element thereby.

It is supposed that the reason for alteration in the surface of the intermediate insulating film in this case is that Si—R group (R refers to lower alkyl group or hydrogen atom) is decomposed (R group is separated) by the wet stripping process and a Si—OH bond is produced.

For example, in the case of organic SOG, a Si—$CH_3$ bond ($CH_3$ is an example) is broken to be Si—OH. In the case of inorganic SOG, a Si—H bond is broken to be Si—OH.

As a treatment applied to such an intermediate insulating film, prior arts have been known which are disclosed in Japanese Patent Application Publication Hei 11-162969, Japanese Patent Application Publication Hei 11-40813 and Japanese Patent Application Publication 2000-352827.

Japanese Patent Application Publication Hei 11-162969 discloses that a lower SOG layer is formed, plasma processing using inert gas such as Ar, Kr, Ne, $N_2$, He or the like is conducted to the lower SOG layer, and thereby the adherence with respect to an upper SOG layer is increased. Japanese Patent Application Publication Hei 11-40813 discloses that plasma processing using low reactivity gas such as $N_2$, Ar, He, $O_2$ or the like is conducted to the surface of a semiconductor element in which a contact region is formed by a dry etching process, residual etching gas or a reaction product is removed, and defect in the semiconductor element is reduced. Japanese Patent Application Publication 2000-352827 discloses that a silicon nitride film is formed on a substrate, an etching process is conducted to the silicon nitride film through a photoresist mask, plasma processing is conducted using hydrogen, ammonia, nitrogen, inert gas, or mixed gas thereof, and thereafter a cured surface layer of the photoresist mask is removed by a wet process.

However, in a case where a material having a dielectric constant equal to or less than 2.7 is used in the above-mentioned prior arts, there is a likelihood that alteration or corrosion is caused to the surface of the SOG at the time of a subsequent stripping process because the effect of controlling alteration of the Si—H bond in the surface of the SOG is not sufficient, and thereby the substrate finally obtained has a serious defect.

SUMMARY OF THE INVENTION

According to the present invention, to solve the problems as mentioned above, there is provided a method for processing a coating film comprising the steps of forming a silica group coating film having a dielectric constant equal to or less than 2.7 on a substrate, conducting an etching process to the silica group coating film through a photoresist pattern, processing the silica group coating film, to which an etching process has been conducted, with plasma induced from helium gas, and removing the photoresist pattern by a wet stripping process.

It is possible to prevent damage resulting from a wet stripping process by conducting a pre-treatment for a wet stripping process with plasma induced from helium gas. It is supposed that the reason for this preventive effect is that plasma induced from helium gas attacks the coating film having a Si—H group and the Si—H bond in the surface layer is changed into a Si—O—Si bond.

The dielectric constant equal to or less than 2.7 is preferable for an intermediate insulating film used in a damascene method. The silica group coating film is not limited to a particular one as long as it has such a dielectric constant. The silica group coating film having such a dielectric constant can be achieved by forming with coating liquid as follows:

The coating liquid can include a condensation product which is obtained through hydrolysis of trialkoxysilane within an organic solvent under an acid catalysis. In particular, it is preferable to obtain the coating liquid by dissolving trialkoxysilane having a concentration of 1%–5% by weight in a case of conversion into $SiO_2$ using alkylene glycol dialkyl ether, adding water of 2.5–3.0 mols per 1 mol of the trialkoxysilane to this solution and adjusting the content of alcohol produced through a reaction in a reacting mixture to be less than or equal to 15% by weight after conducting a hydrolytic condensation under an acid catalyst.

An intermediate insulating film having a ladder structure can be obtained by using trialkoxysilane having a concentration of 1%–5% by weight in a case of conversion into $SiO_2$. Independent of being organic or inorganic, by making a ladder structure, a film which is dense and has a low dielectric constant can preferably be formed.

As the above-mentioned trialkoxysilane, it is possible to list trimethoxysilane, triethoxysilane, tripropoxysilane, tributoxysilane, diethoxy monomethoxysilane, monomethoxy dipropoxysilane, dibutoxy monomethoxysilane, ethoxy methoxy propoxysilane, monoethoxy dimethoxysilane, monoethoxy dipropoxysilane, butoxy ethoxy propoxysilane, dimethoxy monopropoxysilane, diethoxy monopropoxysilane, and monobutoxy dimethoxysilane. Among these, compounds preferable in practice are: trimethoxysilane, triethoxysilane, tripropoxysilane, and tributoxysilane. In particular, trimethoxysilane and triethoxysilane are preferable.

As the solvent, in order to increase the stability of preservation, it is necessary to use alkylene glycol dialkyl ether. By using this, it is possible to control a decomposition reaction of a H—Si group in trialkoxysilane or a substitution reaction of a hydroxy group for an alkoxy group in silanol produced as an intermediate product, which occurs in the conventional art using lower alcohol as a solvent, and thereby it is possible to prevent the gelation.

As the alkylene glycol dialkyl ether, it is possible to list a dialkylether type of alkylene glycol such as ethylene glycol dimethylether, ethylene glycol diethylether, ethylene glycol dipropylether, ethylene glycol dibutylether, diethylene glycol dimethylether, diethylene glycol diethylether, diethylene glycol dipropylether, diethylene glycol dibutylether, propylene glycol dimethylether, propylene glycol diethylether, propylene glycol dipropylether, and propylene glycol dibutylether. Among these, a preferable compound is a dialkylether type, in particular, dimethylether of ethylene glycol or propylene glycol. These organic solvents may be used alone or by combining two or is more kinds thereof. Also, these organic solvents are used at a ratio of 10–30 times mol with respect to 1 mol of alkoxysilane.

It is necessary that water used for hydrolysis of trialkoxysilane be within a range of 2.5–3.0 mols with respect to 1 mol of trialkoxysilane, preferably within a range of 2.8–3.0 mols, so as to increase the degree of hydrolysis. If it is beneath this range, although the stability in preservation is increased, the degree of hydrolysis is deteriorated, the content of organic groups in the hydrolysis product is increased, and thereby gas is generated at the time of forming a coating film. If it is above this range, the stability in preservation is deteriorated.

Even if at least one kind of alkylene glycol dialkyl ether is used as a solvent rather than alcohol, since alcohol corresponding to the alkoxy group is inevitably generated in the course of hydrolysis of alkoxysilane, it is necessary to remove the generated alcohol from the reaction system. Specifically, it is necessary to remove the alcohol to be less than or equal to 15% by weight, preferably to be less than or equal to 8% by weight, in the coating liquid. If the alcohol exceeds 15% by weight, the H—Si group and the generated alcohol react with each other, an RO—Si group is generated and the crack limit is deteriorated. In addition, gas is generated at the time of forming a coating film and the above-mentioned trouble is caused.

As a method for removing the alcohol, it is preferable to conduct distillation under reduced pressure for 2–6 hours in a temperature of 20–50° C. in a degree of vacuum of 30–300 mmHg, preferably 50–200 mmHg. The coating liquid obtained in this manner has characteristics of showing the increase in the weight of the film-forming component after the removal of the solvent in a thermogravimetric analysis, and not having a peak at 3,000 $cm^{-1}$ in the infrared absorption spectrum. The conventional coating liquid, which is described in Japanese unexamined patent application publication No. Hei 4-216827(1992), shows a decrease in the weight in a thermogravimetric analysis, and has a peak in the vicinity of 3,000 $cm^{-1}$ in the infrared absorption spectrum, which indicates that alkoxy group still exists therein.

One kind selected from polyalkylene glycol and the end alkylation product thereof may be included in the coating liquid. As a result of this, an intermediate insulating film can be made porous and the dielectric constant can be decreased.

As the polyalkylene glycol, it is possible to list lower polyalkylene glycol such as polyethylene glycol, polypropylene glycol or the like. The end alkylation product means lower polyalkylene glycol in which a hydroxy group in one or both end(s) of the lower polyalkylene glycol is made to be alkoxyl with a lower alkyl group such as a methyl group, an ethyl group, a propyl group, or the like.

The addition amount of the one kind selected from polyalkylene glycol and the end alkylation product is 10%–500% by weight, preferably 50%–200% by weight, with respect to the solid component of the coating liquid.

The weight-average molecular weight of the polyalkylene glycol and the end alkylation product is 100–10,000, preferably 200–5,000. This range can easily make the dielectric constant lower without any damage to solubility in the coating liquid.

Further, as a photoresist stripping solution for the wet stripping process, an amine group stripping solution including an amine group such as hydroxylamine, a hydrofluoric acid group stripping solution including ammonium fluoride, or a stripping solution of a mixed group thereof can be used.

A stripping solution for photoresist which is selected from the above-mentioned groups can be used in the wet stripping process of the present invention.

According to the present invention, there is also provided a method for manufacturing a semiconductor element comprising the following steps of:

(1) forming a silica group coating film having a dielectric constant equal to or less than 2.7 on a substrate;
(2) providing a photoresist pattern on the silica group coating film;
(3) conducting an etching process to the silica group coating film using the photoresist pattern as a mask;
(4) processing the silica group coating film with plasma induced from helium gas; and
(5) conducting a wet stripping process to the photoresist pattern.

In the above-mentioned step of forming a silica group coating film, for example, coating liquid is applied onto a substrate such as a semiconductor substrate, a glass substrate, a metal plate, a ceramic substrate, or the like by means of a spinner method, a roll coater method, an immersion coating method, a spray method, a screen printing method, a brush painting method, or the like. It is dried to evaporate the solvent therein, fired in a temperature of 250–500° C., and a coating film is formed.

In the above steps (2), (3) and (5), the conventional means and methods can be used.

In the step of processing the silica group coating film with plasma induced from helium gas, a plasma processing apparatus for generating plasma gas from the above-mentioned gas (for example, TCA-7822 manufactured by Tokyo Ohka Kogyo Co., Ltd.) is used. The plasma processing is conducted under pressure of 10–600 mTorr, preferably 100–500 mTorr, and for 30–300 seconds, preferably 30–120 seconds.

Another plasma processing apparatus may be used besides the TCA-7822.

DETAILED DESCRIPTION OF PREFERRED EMBODIMENTS

Hereinafter, embodiments according to the present invention will be fully explained with reference to the attached drawings.

(Embodiment 1)

Triethoxysilane of 73.9 g (0.45 mol) having a concentration of 3% by weight in a case of conversion into $SiO_2$ is dissolved and stirred into ethylene glycol dimethylether of 799.0 g (8.87 mol), a mixture of pure water of 24.2 g (1.34 mol) and strong nitric acid of 5 ppm is slowly stirred and dropped thereinto, and it is stirred for about 3 hours. Thereafter, it is left still for 6 days at room temperature, so as to obtain a solution.

Reduced-pressure distillation is conducted to this solution at 120–140 mmHg and 40° C. for 1 hour, and a solution in which the concentration of solid component is 8% by weight and the concentration of ethanol is 3% by weight is prepared. A both-end methylation product of polyethylene glycol having weight-average molecular weight of 200 is added to this solution at a ratio of 100% by weight to the solid component, is sufficiently stirred, and thereby a uniform solution is obtained. This solution is a coating liquid.

A substrate is rotated and coated with this coating liquid, and thereby a coating film having a thickness of 4500 Å and a refractive index of 1.40 is formed on the substrate.

Plasma processing is conducted with helium gas having a concentration of 700 sccm at the pressure of 500 mTorr for 30 seconds.

A wet stripping process is conducted with an amine group stripping solution for photoresist (SST-3 manufactured by Tokyo Ohka Kogyo Co., Ltd.) through immersion at 80° C. for 10 minutes.

Figure 1:
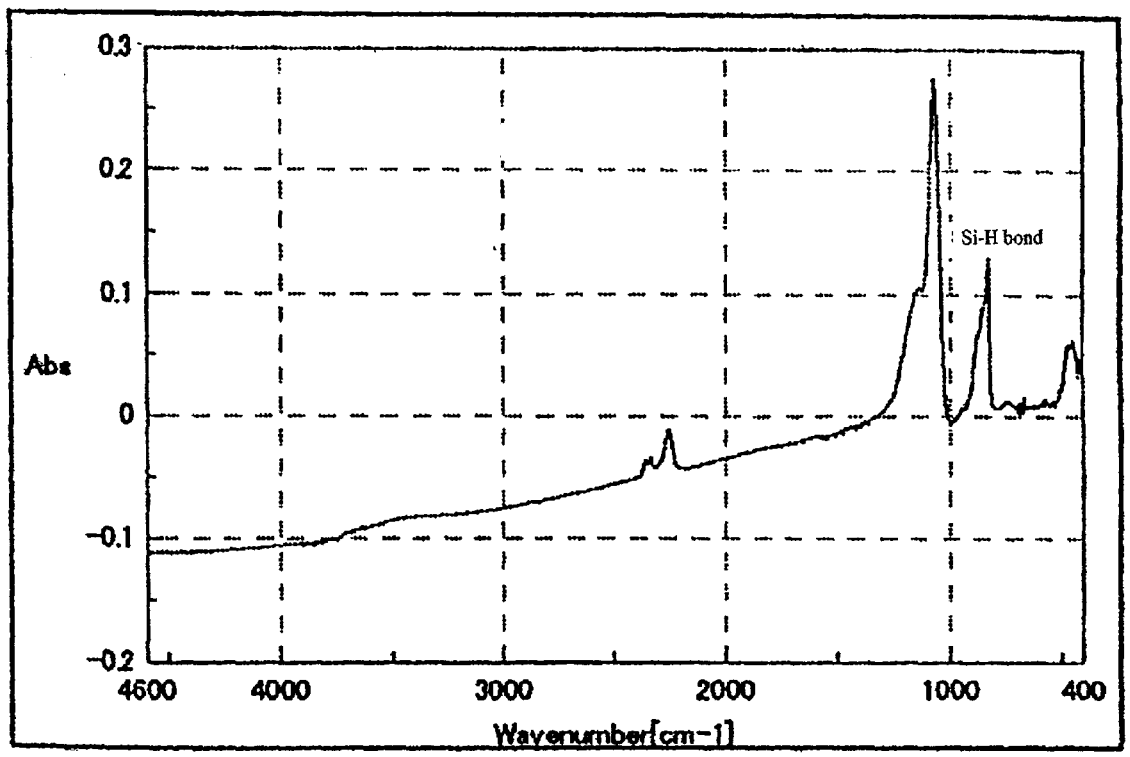
FIG. 1 is a graph showing the infrared absorption spectrum of a coating film after the stripping process according to embodiment 1 of the present invention.

A SOG layer in this instance is observed by an IR measurement. As shown in FIG. 1, the Si—H bond is left and no alteration in the surface is recognized. Also, the photoresist film and the residue after the etching process is completely removed.

(Comparative Example 1)

Figure 2:
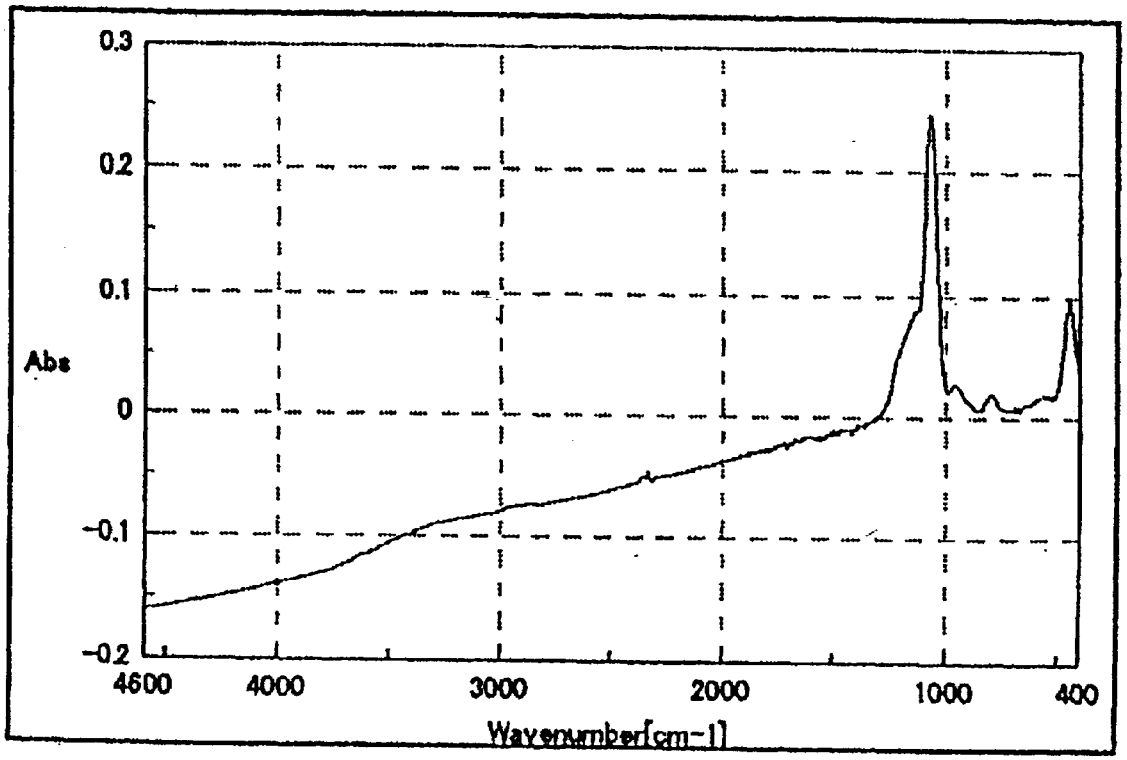
FIG. 2 is a graph showing the infrared absorption spectrum of a coating film after the stripping process according to comparative example 1 of the present invention.

The same method as in embodiment 1 is used, except that the processing using helium gas is omitted. The IR measurement indicates that the Si—H bond is broken down as shown in FIG. 2.

(Embodiment 2)

The same method as in embodiment 1 is conducted, except that a wet stripping process is conducted with a hydrofluoric acid group stripping solution for photoresist (SST-A2 manufactured by Tokyo Ohka Kogyo Co., Ltd.) at 25° C. for 10 minutes.

Figure 3:
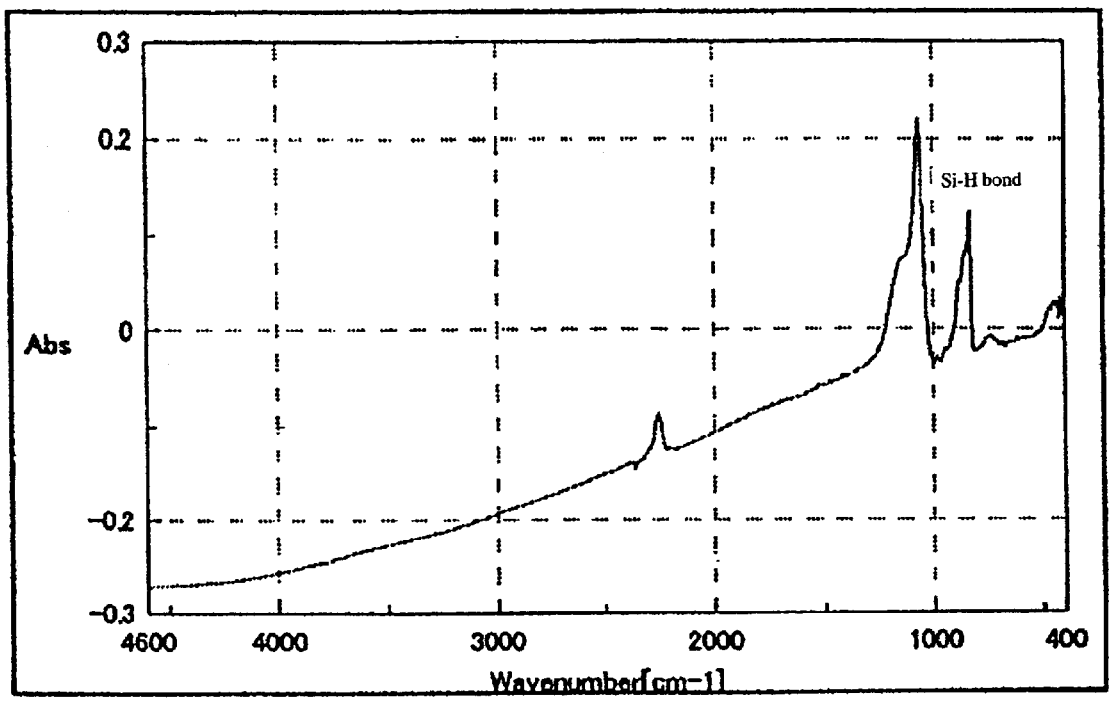
FIG. 3 is a graph showing the infrared absorption spectrum of a coating film after the stripping process according to embodiment 2 of the present invention.

A SOG layer in this instanse is observed by an IR measurement. As shown in FIG. 3, the Si—H bond is left and no alteration in the surface is recognized. Also, the photoresist film and the residue after the etching process is completely removed.

(Comparative Example 2)

Figure 4:
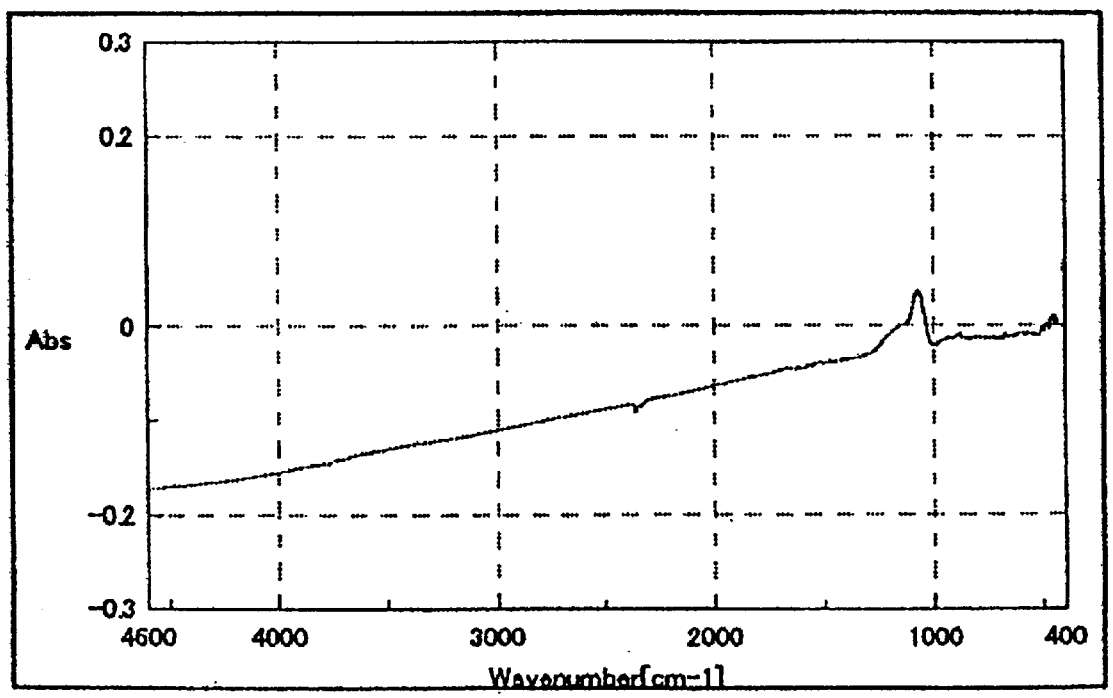
FIG. 4 is a graph showing the infrared absorption spectrum of a coating film after the stripping process according to comparative example 2 of the present invention.

The same method as in embodiment 2 is used, except that the processing using helium gas is omitted. The IR measurement indicates that the Si—H bond is broken down as shown in FIG. 4.

(Embodiment 3)

The same method as in embodiment 1 is conducted, except that a wet stripping process is conducted with a stripping solution for photoresist which is obtained by mixing amine with a hydrofluoric acid group stripping solution (SST-A7 manufactured by Tokyo Ohka Kogyo Co., Ltd.) at 25° C. for 10 minutes.

Figure 5:
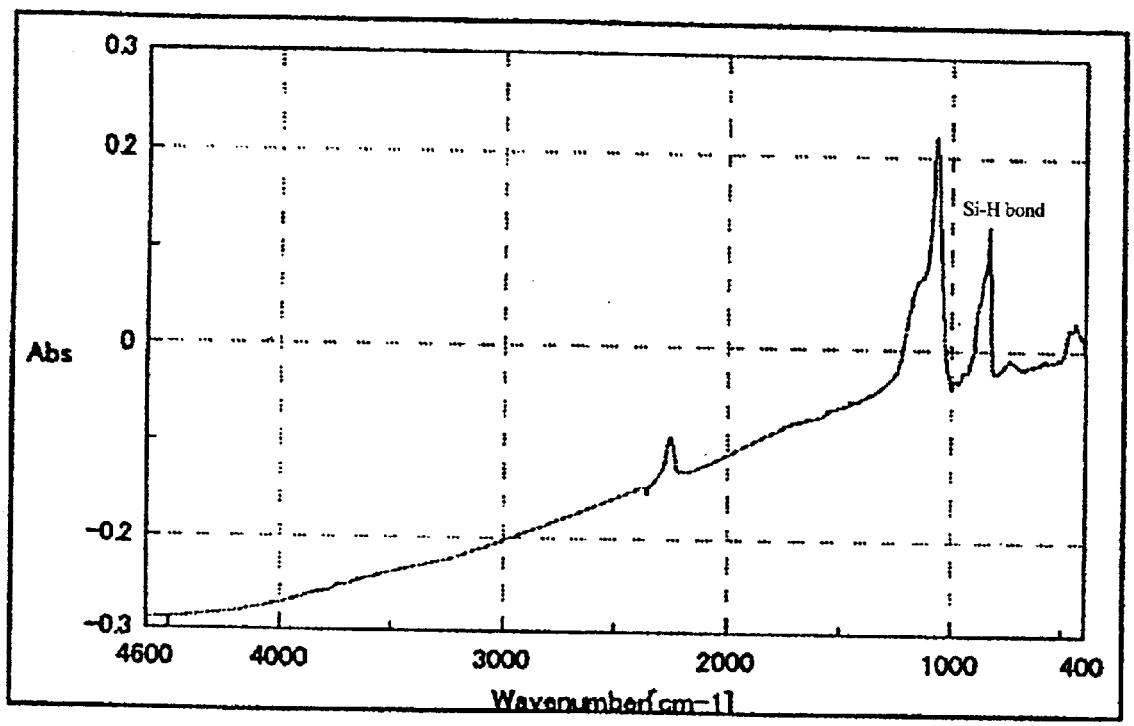
FIG. 5 is a graph showing the infrared absorption spectrum of a coating film after the stripping process according to embodiment 3 of the present invention.

A SOG layer in this instance is observed by an IR measurement. As shown in FIG. 5, the Si—H bond is left and no alteration in the surface is recognized. Also, the photoresist film and the residue after the etching process is completely removed.

(Comparative Example 3)

Figure 6:
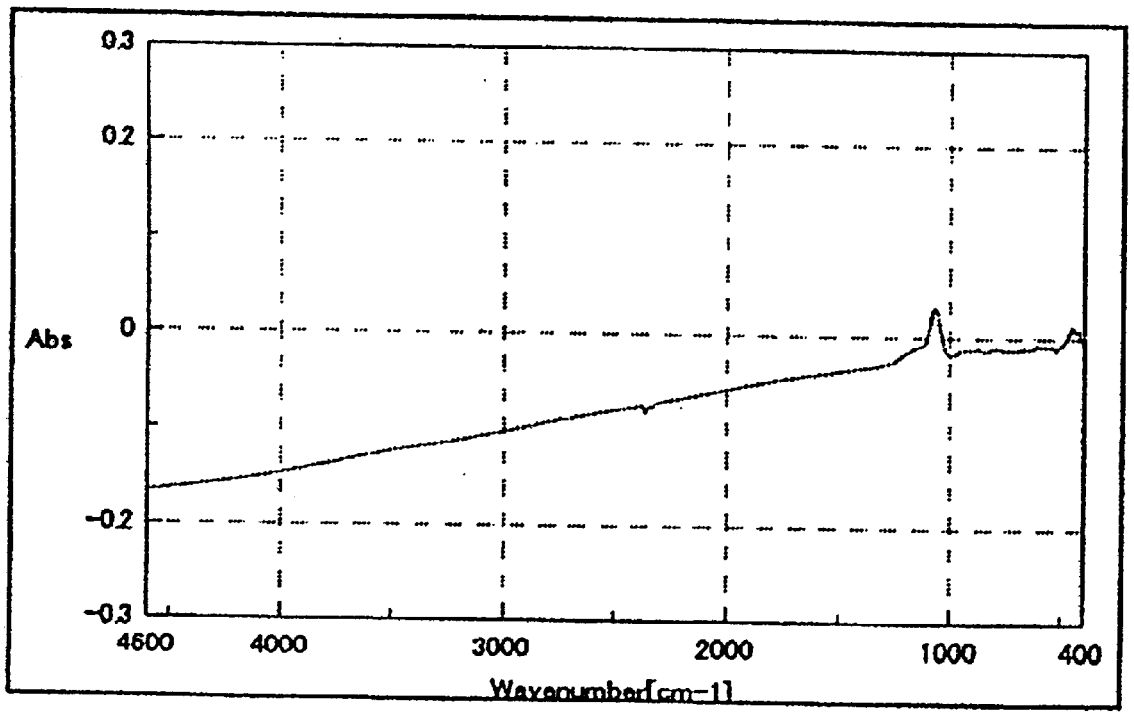
FIG. 6 is a graph showing the infrared absorption spectrum of a coating film after the stripping process according to comparative example 3 of the present invention.
Figure 7:
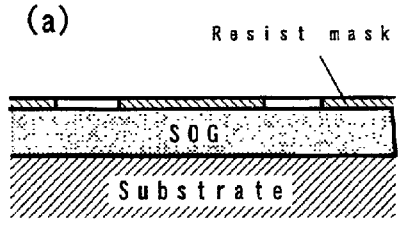
FIGS. 7(a)–(h) show the steps of forming a multi-layer wiring structure using a copper damascene method.
Figure 7:
Figure 7:
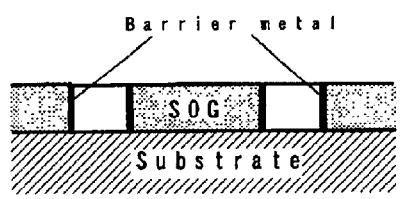
Figure 7:
Figure 7:
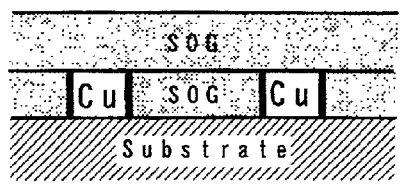
Figure 7:
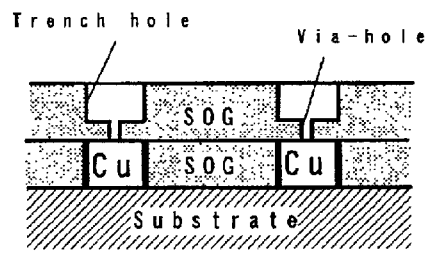
Figure 7:
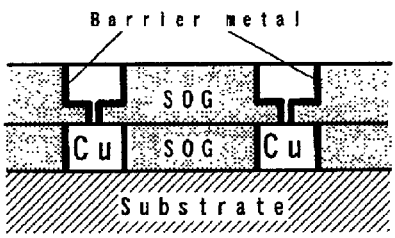
Figure 7:
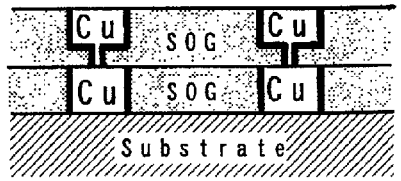

The same method as in embodiment 3 is used, except that the processing using helium gas is omitted. The IR measurement indicates that the Si—H bond is broken down as shown in FIG. 6.

(Comparative Example 4)

The same method as in embodiment 2 is used, except that mixed gas of nitrogen and hydrogen (mixing ratio $N_2:H_2=$ 97:3) is used instead of helium gas in embodiment 2 and also the processing is conducted with the mixed gas having a concentration of 80 sccm at the pressure of 150 mTorr for 60 seconds.

The IR measurement indicates that the Si—H bond is broken down. As a result of this, the k value of the SOG layer becomes high, whereby the insulating property thereof is deteriorated. Also, the Si—H bond is transformed into a Si—OH bond which can cause trouble such as degas in a subsequent process of forming a multi-layer structure.

As is fully described in the above, according to the present invention, since an etching process is conducted to a silica group coating film having a dielectric constant equal to or less than 2.7 formed on a substrate through a photoresist pattern, and thereafter, plasma processing is conducted to the silica group coating film with plasma induced from helium gas, the silica group coating film is not damaged when a wet stripping process is conducted to the photoresist pattern as a subsequent process, and the low dielectric constant can be maintained.

Therefore, if the present invention is applied to the damascene method, it is possible to obtain a reliable semiconductor element.

Also, according to the present invention, since one kind selected from polyalkylene glycol and the end alkylation product thereof is included in a coating liquid, the dielectric constant of the silica group coating film formed with the coating liquid can be lowered, which is advantageous to a fine product.

Although there have been described in detail what are the present embodiments of the invention, it will be understood by persons skilled in the art that variations and modifications may be made thereto without departing from the gist, spirit or essence of the inventions. The scope of the invention is indicated by the appended claims.

What is claimed is:

1. A method for processing a coating film comprising the steps of:

forming a silica group coating film having a dielectric constant equal to or less than 2.7 on a substrate;

conducting an etching process to said silica group coating film through a photoresist pattern;

processing said silica group coating film, to which said etching process has been conducted, with plasma induced from helium gas; and conducting a wet stripping process to said photoresist pattern.

2. A method for processing a coating film as defined in claim 1, wherein a stripping solution used in said wet stripping process has a composition including at least one of an ammonium fluoride compound and an alkanolamine compound.

3. A method for processing a coating film as defined in claim 1, wherein said formed silica group coating film is porous.

4. A method for processing a coating film as defined in claim 1, wherein said formed silica group coating film has a ladder structure.

5. A method for processing a coating film as defined in claim 1, wherein a coating liquid for forming said silica group coating film includes at least one of polyalkylene glycol and the end alkylation product thereof.

6. A method for processing a coating film as defined in claim 5, wherein a stripping solution used in said wet stripping process has a composition including at least one of an ammonium fluoride compound and an alkanolamine compound.

7. A method for processing a coating film as defined in claim 1, wherein a coating liquid for forming said silica group coating film comprises a condensation product obtained through hydrolysis of trialkoxysilane within an organic solvent under an acid catalysis.

8. A method for processing a coating film as defined in claim 7, wherein said organic solvent is alkylene glycol dialkyl ether.

9. A method for processing a coating film as defined in claim 7, wherein an alcohol content of said coating liquid is $\leq 15\%$ by weight.

10. A method for manufacturing a semiconductor element comprising the following steps of:

(1) forming a silica group coating film having a dielectric constant equal to or less than 2.7 on a substrate;

(2) providing a photoresist pattern on said silica group coating film;

(3) conducting an etching process to said silica group coating film using said photoresist pattern as a mask;

(4) processing said silica group coating film with plasma induced from helium gas, subsequent to said etching process; and (5) conducting a wet stripping process to said photoresist pattern.

11. A method for manufacturing a semiconductor element as defined in claim 10, wherein a stripping solution used in said wet stripping process has a composition including at least one of an ammonium fluoride compound and an alkanolamine compound.

12. A method for manufacturing a semiconductor element as defined in claim 10, wherein said formed silica group coating film is porous.

13. A method for manufacturing a semiconductor element as defined in claim 10, wherein said formed silica group coating film has a ladder structure.

14. A method for manufacturing a semiconductor element as defined in claim 10, wherein a coating liquid for forming said silica group coating film includes at least one of polyalkylene glycol and the end alkylation product thereof.

15. A method for manufacturing a semiconductor element as defined in claim 14, wherein a stripping solution used in said wet stripping process has a composition including at least one of an ammonium fluoride compound and an alkanolamine compound.

16. A method for manufacturing a semiconductor element as defined in claim 10, wherein a coating liquid for forming said silica group coating film comprises a condensation product obtained through hydrolysis of trialkoxysilane within an organic solvent under an acid catalysis.

17. A method for processing a coating film as defined in claim 16, wherein said organic solvent is alkylene glycol dialkyl ether.

18. A method for processing a coating film as defined in claim 16, wherein an alcohol content of said coating liquid is $\leq 15\%$ by weight.

* * * * *